(12) United States Patent
Murphy et al.

(10) Patent No.: US 6,177,627 B1
(45) Date of Patent: Jan. 23, 2001

(54) SOLAR CELL ARRAY WITH MULTIPLE ROWS OF CELLS AND COLLAPSIBLE REFLECTORS

(75) Inventors: Dave Murphy, Santa Barbara; Michael I. Eskenazi; Brian R. Spence, both of Goleta, all of CA (US)

(73) Assignee: ACE-Able Engineering Co., Inc., Goleta, CA (US)

(\*) Notice: Under 35 U.S.C. 154(b), the term of this patent shall be extended for 0 days.

(21) Appl. No.: 09/337,624

(22) Filed: Jun. 21, 1999

(51) Int. Cl.$^7$ ..................................................... H01L 25/00
(52) U.S. Cl. ........................... 136/246; 136/292; 136/245
(58) Field of Search .................... 136/246, 292, 136/245

(56) References Cited

U.S. PATENT DOCUMENTS

| | | | |
|---|---|---|---|
| 4,134,387 | 1/1979 | Tornstrom | 126/270 |
| 4,313,422 | 2/1982 | McEntee | 126/426 |
| 4,316,448 | 2/1982 | Dodge | 126/424 |
| 4,384,164 | 5/1983 | Richard | 136/245 |
| 5,288,337 | * 2/1994 | Mitchell | 136/246 |
| 5,344,496 | 9/1994 | Stern et al. | 136/246 |
| 5,496,414 | 3/1996 | Harvey et al. | 136/245 |
| 5,520,747 | 5/1996 | Marks | 136/245 |
| 5,885,367 | 3/1999 | Brown et al. | 136/245 |
| 5,979,834 | 11/1999 | Falbel | 244/173 |
| 6,017,002 | 1/2000 | Burke et al. | 244/173 |

\* cited by examiner

*Primary Examiner*—Mark Chapman
(74) *Attorney, Agent, or Firm*—Lyon & Lyon LLP

(57) ABSTRACT

An improved solar panel for a spacecraft. The solar panel has a rigid base, at least one row of solar cells, and at least one elongated, collapsible, self-deploying reflector. Preferably, a plurality of rows and the reflectors are mounted on the face of the base and are generally parallel to each other in an alternating fashion. The deployed reflector forms a triangular shape having a first and second reflecting side that reflects radiation onto adjacent rows of solar cells.

The collapsible reflector has a reflector sheet and an erector that deploys the sheet to form the triangular shape. The sheet is mounted to the base along its two lengthwise edges. The erector is mounted to the base beneath the sheet and adjacent to one of the sheet's lengthwise edges. The erector has a rigid erector arm that tilts upwardly to engage the underside of the sheet and to deploy the sheet into the triangular shape. The deployed triangular shape comprises a first and second reflecting side that reflects incident radiation onto adjacent rows of solar cells. Preferably, the first and second reflecting sides of the reflector are substantially symmetrically disposed about the longitudinal bisecting plane of the reflector when the reflector is in a deployed position.

3 Claims, 2 Drawing Sheets

SOLAR CELL ARRAY WITH MULTIPLE ROWS OF CELLS AND COLLAPSIBLE REFLECTORS

FIELD OF THE INVENTION

A solar cell array with collapsible reflectors that inherently erect to form reflecting surfaces which concentrate solar energy onto rows of cells.

BACKGROUND OF THE INVENTION

The harvesting of a large cross-section area of solar energy from a smaller area of solar cells by concentration is a well-recognized art. Known techniques include using lenses such as fresnel lenses to focus the energy onto the cells, and large mirror arrangements to reflect the energy to the cells. However effective these known devices may be in directing energy from a larger area onto a smaller area, they bring with them many problems of practical concern when used for spacecraft.

Land-based apparatus to capture solar energy involves no special problems. Weight, rigidity, variability of environmental conditions such as temperature, and reliability are of lesser concern or may be of concern at all. Most of them can be minimized or corrected by over-design of the apparatus. It is built in place and stays there. Temperature variability is relatively minor. Weight is no concern. Neither is perfect reliability, because within reason the apparatus is accessible and readily repaired. Structural efficiency is really not an issue. A ground based device may simply be made as heavy and strong as desired, with a generous allowance for safety.

Such is not the circumstance for spacecraft. Weight is a primary consideration not only because of the cost per pound to launch the apparatus, but because weight of one part of a spacecraft will necessarily require a reduction of weight elsewhere due to the ultimate limitation on the total launch weight of the entire craft.

Reliability is also a prime concern. Spacecraft are one-way vehicles. Once in space they remain there during their useful life, and except in a few extraordinary situations such as the Hubble Telescope, they will never be approached after launch. The failure of apparatus such as a solar array dooms all or a large part of the intended life and function of the entire craft.

Rigidity in the sense of maintenance of shape under varying conditions is made complicated by the extreme variations in temperature as the apparatus enters and leaves the shadow of the earth. While in the shadow, temperatures as low as −180 degrees C are endured. While out of the shadow and exposed directly to the sun, temperatures as high as 110 degrees C are endured. When the solar panels transition between light and shadow, the change in temperature of the apparatus occurs in only a few minutes, and does not occur uniformly throughout. This results in a reaction known as "thermal snap" in which the distortions that result from rapid temperature change cause a quick bending distortion that shudders the spacecraft and can damage the wing.

As the wing temperatures change over the sunlit portion of the orbit, distortions of the structure can cause the concentrator optics to malfunction. Even more, high temperatures are the enemy of solar cells. It is important to mount the cells in an arrangement such that the energy received by them does not heat the entire array of cells to an unacceptable temperature. This is further complicated if large reflecting areas are involved where there may be localized higher temperatures due to distortions of the reflector.

This is a daunting array of requirements. Over the decades there has been a long succession of solar arrays produced and launched. Many have been successful, but a disheartening proportion of them have failed partially or totally, causing the loss of very costly space vehicles, or a major reduction in their useful life.

It is an object of this invention to provide a lightweight, structurally integral solar array that is readily packed for launch. Upon being opened in space it will itself erect to an operational configuration, without requiring energy or exertion from another source.

It is another object to provide a structure which is forgiving of both global and localized temperature variations, and whose shape is inherently biased toward the optimum.

BRIEF DESCRIPTION OF THE INVENTION

This invention is accomplished in combination with a structural panel upon which spaced apart parallel lines of solar cells are mounted. A spacing on the flat face is provided between each pair of lines of cells. The lines of cells have a dimension of length and a dimension of width. The spacings have a dimension of length and a dimension of base width. The spacings provide a reflector base. A reflector is mounted to each of said reflector bases, extending along said base, parallel to adjacent lines of cells.

A reflector according to this invention is, when erected, shaped as a triangular prism with a base and two reflecting legs, the legs being equal in length to one another so as to form an isosceles triangle whose base angle is such that each side reflects incident energy onto an adjacent cell, whereby energy which would have impacted on a spacing beneath the reflectors is instead reflected to a cell. Because cells are not needed for the area underneath the reflectors, a considerable saving is made.

According to this invention the reflector comprises a flexible, reflective sheet having a dimension of sheet length equal to the base length, a defined dimension of sheet width, and a pair of parallel lengthwise edges. The lengthwise edges of the sheet are fixed to the base at a defined spacing from one another. The dimension of sheet width is about twice the intended length of each arm.

An erector is mounted to the base underneath the sheet. It includes a rigid erector arm with a dimension of length substantially equal to one half of the defined sheet width. The erector arm is angularly pivotally movable relative to the base. It is biased away from the base. The base angles formed by the erector arm are determined by the length of the erector arm and the defined sheet width. With these dimensions established, only one triangle can be formed.

Absent external applied forces, the erector arm will tilt upwardly to engage the underside of the sheet and form the triangular shape. Further tilting movement will be prevented by engagement with the sheet which is relatively inelastic and defines the total length of the two legs.

According to a feature of the invention, the dimensions of base, sheet width and arm length are selected to provide a base angle and reflector height such that energy incident on a surface of the sheet will be reflected over a substantial area of an adjacent cell.

According to a preferred but optional feature of the invention, the erector arm is formed as part of a springy metal sheet having a first fold applied to the base, and a second fold bearing on the underside of the sheet. The metal sheet is self-biased toward an unfolded shape at the fold, whereby the reflector can be compressed toward a flattened configuration by pressing on the sheet to fold the erector. The second fold will be recognized as the erector arm.

The above and other features of this invention will be fully understood from the following detailed description and the accompanying drawings, in which:

DETAILED DESCRIPTION OF THE INVENTION

Figure 1:
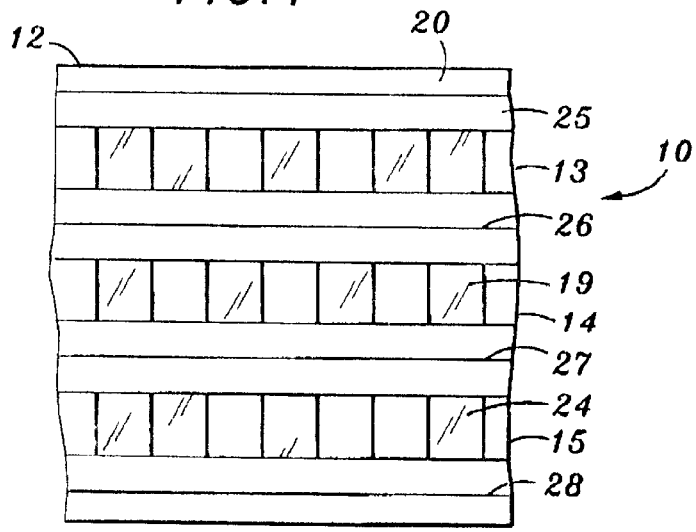
FIG. 1 is a plan view of a solar array according to the invention.
Figure 1A:
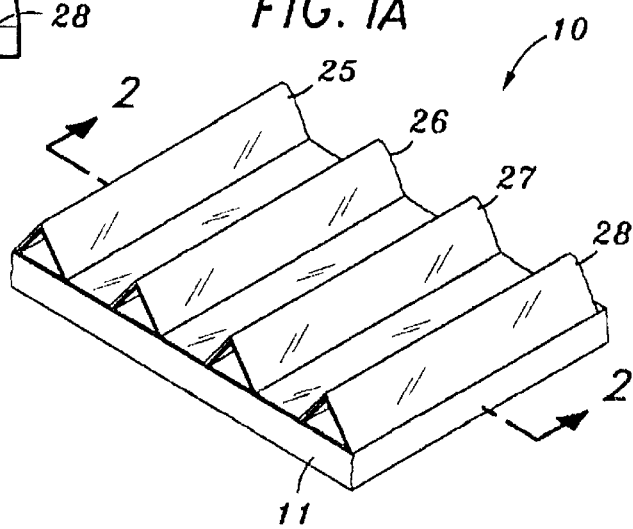
FIG. 1A is a perspective view of FIG. 1.
Figure 2:
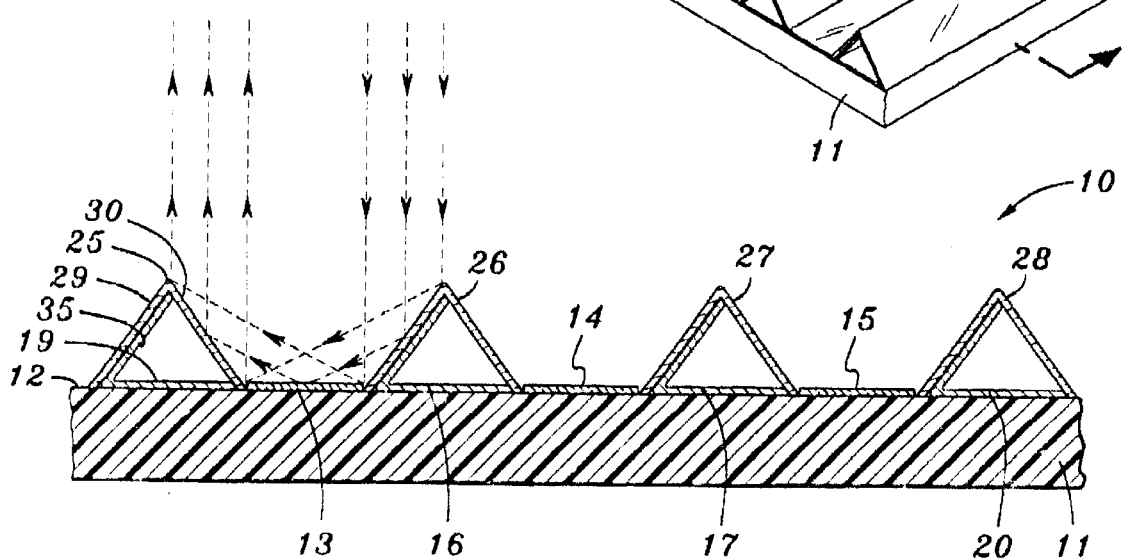
FIG. 2 is a cross-section taken at line 2—2 in FIG. 1.

A solar array 10 according to this invention is shown in FIGS. 1 and 2. An insulating panel 11 has a front surface 12. Lines 13, 14 and 15 of solar cells are parallel to one another. Adjacent lines are spaced apart by spacings 16, 17. Edge spacings 19, 20 are formed next to the two outside lines.

Lines 13, 14 and 15 are formed by individual solar cells 24 which are applied to front surface 12. They are conductively interconnected by conventional means. The types of circuit connections, and their connection into external circuitry form no part of this invention. The cells are only 4 to 8 mils thick.

Reflectors 25, 26, 27, 28 are mounted to respective surfaces 19, 16, 17 and 20. The function of these reflectors is to reflect onto an adjacent line of cells the solar energy which impinges on the reflector. In effect this reduces the necessary solar cell area by a factor determined by the ratio between the frontal exposure of the reflectors and the cells. In most installations, it will reduce the cell area by about half. This is a profound saving in cost and weight, both of which are important in space applications.

The economies of this invention extend well beyond the geometric relationship. It has further advantages of lightness of weight, substantial reduction of cubic volume in the stowed configuration, very low cost, and simplicity of construction.

Figure 3:
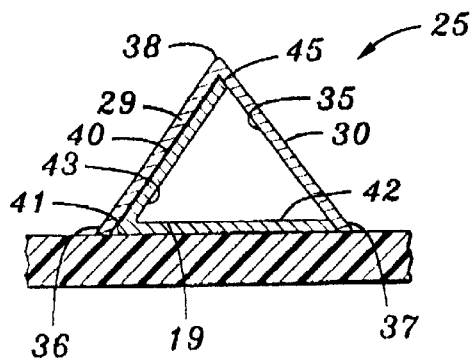
FIG. 3 is an end view showing the presently-preferred embodiment of reflector in its erect configuration.

Only reflector 25 will be described in detail (FIG. 3). It is identical to all of the others, so they will not be individually described. Its reflective surfaces 29, 30 are two legs of a triangle formed by them (or, more precisely, by a plane having such legs and a dimension of length), and by the spacing 19 at which the edges of the sheet are attached.

The reflector sheet 35 is flexible and metallized. For space applications it will be of a thin material resistant to the environment. A suitable example is 0.001 inch thick Kapton (TM), coated with a thin layer of aluminum. Preferably the sheet is relative inelastic. Its edges 36, 37 are attached to the panel base at the edges of the respective spacing. Its defined width, when an isosceles triangle shape is desired, is twice that of the length of the legs. When erect, a dihedral edge 38 is formed, which is parallel to the spacing and to the lines of cells.

An erector 40 is a folded springy metal plate. For example, a sheet of spring steel about 0.002 inches thick can be folded or lightly creased at a dihedral edge 41. This forms a base arm 42 and an erector arm 43. These arms are sometimes referred to a "folds". The base arm is fixed to the panel at a spacing. The rigid erector arm is inherently biased by the springiness of the material toward the erected shape shown in FIG. 3. Actually, if not restrained by the reflector sheet, the erector would tend to open even farther. This bias toward an open, erected, condition is sometimes referred to as pivotal and biased. Indeed, a hinged structure with a spring bias would be useful but would be unnecessarily heavy and complicated. For terrestrial use, these disadvantages could in some instances be acceptable. Therefore the term "pivotal" includes the illustrated springy folded construction and any other arrangement that enables the erector arm to be raised.

The erector includes a fold-forming edge 45 over which the sheet is bent in the erect configuration to form dihedral edge 38. It extends parallel to the lines of cells.

Figure 4:
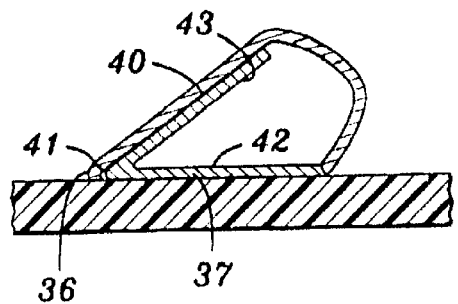
FIG. 4 is an end view showing the reflector of FIG. 3 partially compressed.
Figure 5:
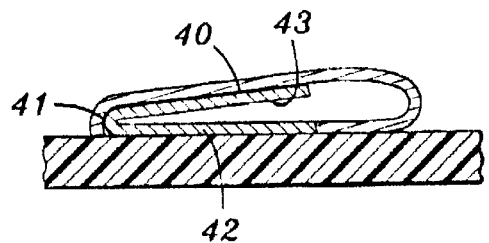
FIG. 5 is an end view showing the reflector of FIG. 3 in its fully stowed (compressed) configuration.

FIG. 3 shows the erect configuration. FIG. 4 shows a partially stowed intermediate configuration. The erector arm will have been pressed down, and the sheet will have some slack. FIG. 5 shows the stowed configuration. The slack sheet may take any arbitrary shape. Some of it will overlay adjacent cells (not shown), but this does no harm.

The rows of reflectors may be pressed into the stowed position by a plate applied to them. The plate when released will enable the erectors to unfold to the extent permitted by the width of flexible material.

Figure 6:
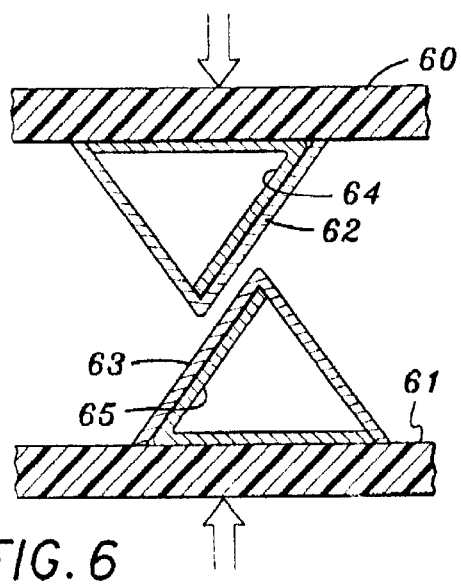
FIG. 6 is a fragmentary view of two confronting arrays before being stowed.
Figure 7:
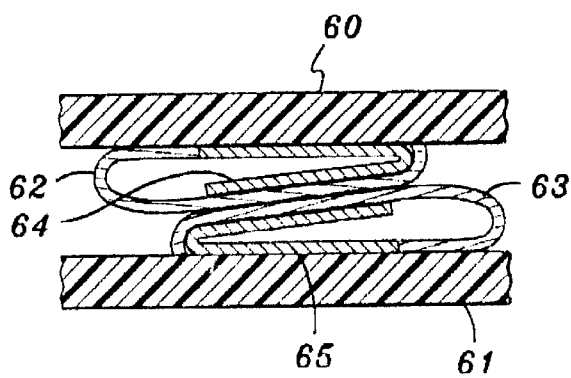
FIG. 7 shows the arrays of FIG. 6 brought together in the stowed configuration.

A more interesting form of stowage is shown in FIGS. 6 and 7 in which two panels 60, 61 are brought toward each other with reflectors 62, 63 facing each other. The reflectors should be offset a bit so the folding of the erectors 64, 65 is facilitated. As shown in FIG. 7, when the panels are pressed to maximum adjacency the erectors are nearly fully folded by each other, and the thickness of the stowed two panel array is minimized.

Suitable dimensions for this device are as follows:

| | |
|---|---|
| Width of the cells: | 7 cm |
| Width of the reflector bases: | 7 cm (up to 10 cm) |
| Included apex angle at the tip of the reflector: | 40–65 degrees |

The preferred apex angle is about 60 degrees (30 degrees half angle), because then one side of the reflector will reflect its energy over the entire surface of an adjacent line of cells, when the width of the cells and of the reflector base are about equal.

A somewhat larger tip angle may direct some energy at the edge beyond the cell, but would then provide for more tolerance when the array is not precisely normal to the incident energy.

This invention is not to be limited by the embodiment shown in the drawings and described in the description, which is given by way of example and not of limitation, but only in accordance with the scope of the appended claims.

We claim:

1. A collapsible reflector to reflect incident energy onto directly adjacent solar cells, comprising:

a rigid base having a plurality of solar cells mounted thereon, said base having a dimension of base length and a defined dimension of base width, comprising:

a flexible inelastic sheet having a pair of opposite surfaces, a dimension of sheet length substantially equal to the dimension of base length, and a defined dimension of sheet width, said sheet having a pair of parallel lengthwise edges, said edges being fixed to said base spaced apart by said base width, said sheet being reflective of said energy on its surfaces which faces away from said base;

an erector mounted to said base beneath the sheet and adjacent to one of said sheet edges, said erector having a rigid arm with a length from the base substantially equal to one half of the dimension of sheet width, said rigid arm being pivotally biased so as to tend to pivot away from the base, whereby to raise the sheet and form the sheet as the legs of an isosceles triangle, the legs being equal to one another and also to the length of the rigid arm;

whereby, absent external forces, said erector will raise said sheet to form said legs and upon exertion of compressive force said rigid arm will pivot toward said base and said sheet will collapse.

2. A collapsible reflector according to claim 1 in which said erector is a folded springy plate having flat panels and a fold, one of said panels being fixed to a spacing and the other comprising the rigid arm, said rigid arm having a forming edge parallel to said lines of cells to form the apex of the isosceles triangle.

3. A collapsible reflector according to claim 2 in which said sheet is substantially inelastic.

* * * * *

UNITED STATES PATENT AND TRADEMARK OFFICE
CERTIFICATE OF CORRECTION

PATENT NO. : 6,177,627 B1
DATED : January 23, 2001
INVENTOR(S) : David Murphy et al.

Page 1 of 1

It is certified that error appears in the above-identified patent and that said Letters Patent is hereby corrected as shown below:

Please change the name of the assignee from ACE-Able Engineering Co., Inc. to AEC-Able Engineering Co., Inc.

Signed and Sealed this

Tenth Day of July, 2001

*Attest:*

*Attesting Officer*

NICHOLAS P. GODICI
*Acting Director of the United States Patent and Trademark Office*